United States Patent
Ariyama

(10) Patent No.: US 10,914,610 B2
(45) Date of Patent: Feb. 9, 2021

(54) ZERO CROSS DETECTION CIRCUIT AND SENSOR DEVICE

(71) Applicant: ABLIC Inc., Chiba (JP)

(72) Inventor: Minoru Ariyama, Chiba (JP)

(73) Assignee: ABLIC INC., Chiba (JP)

( * ) Notice: Subject to any disclaimer, the term of this patent is extended or adjusted under 35 U.S.C. 154(b) by 37 days.

(21) Appl. No.: 16/390,839

(22) Filed: Apr. 22, 2019

(65) Prior Publication Data

US 2019/0323859 A1  Oct. 24, 2019

(30) Foreign Application Priority Data

Apr. 24, 2018  (JP) ................................ 2018-083376

(51) Int. Cl.
*G01B 7/30* (2006.01)
*G01D 5/14* (2006.01)

(52) U.S. Cl.
CPC .................................. *G01D 5/145* (2013.01)

(58) Field of Classification Search
CPC .. G01R 19/175; G01R 19/04; G01R 19/0069; G01R 31/343; G01R 33/072; G01R 33/077; G01R 33/09; G01R 19/12; G01D 5/145
See application file for complete search history.

(56) References Cited

U.S. PATENT DOCUMENTS

| | | | |
|---|---|---|---|
| 5,334,930 A * | 8/1994 | Onodera | G01R 19/04 324/103 P |
| 5,361,175 A | 11/1994 | Richardson et al. | |
| 5,754,507 A * | 5/1998 | Nishikata | G11B 7/08511 369/44.29 |
| 8,634,211 B2 * | 1/2014 | Lee | H02M 7/2176 363/21.03 |
| 8,664,943 B2 * | 3/2014 | Okada | G01R 33/07 324/207.2 |
| 8,970,790 B2 * | 3/2015 | Murakami | H02M 3/1563 348/730 |
| 9,722,729 B2 | 8/2017 | Magin et al. | |
| 9,812,983 B2 | 11/2017 | Inoue | |
| 2012/0020133 A1 * | 1/2012 | Lee | H02M 7/2176 363/126 |
| 2012/0249124 A1 | 10/2012 | Ionescu | |
| 2017/0336445 A1 | 11/2017 | Ariyama | |

FOREIGN PATENT DOCUMENTS

| JP | H07-130082 A | 5/1995 |
|---|---|---|
| JP | 6-127275 B2 | 5/2017 |
| JP | 2017-211365 A | 11/2017 |

OTHER PUBLICATIONS

Extended European Search Report in Europe Application No. 19170853.6, dated Oct. 4, 2019, 13 pages.

* cited by examiner

*Primary Examiner* — Thang X Le
(74) *Attorney, Agent, or Firm* — Brinks Gilson & Lione

(57) ABSTRACT

A zero cross detection circuit has a first comparator circuit receiving a first input signal n1 and a second input signal n2 and outputting a first comparison result, a second comparator circuit having a hysteresis, receiving the first input signal n1 and the second input signal n2, and providing a second comparison result, and a logic circuit providing a zero cross detection signal based on the first comparison result and the second comparison result. The logic circuit provides a reverse signal to the second comparator circuit based on the first comparison result and the second comparison result.

8 Claims, 5 Drawing Sheets

PRIOR ART

ZERO CROSS DETECTION CIRCUIT AND SENSOR DEVICE

RELATED APPLICATIONS

This application claims priority under 35 U.S.C. § 119 to Japanese Patent Application No. 2018-083376 filed on Apr. 24, 2018, the entire content of which is hereby incorporated by reference.

BACKGROUND OF THE INVENTION

1. Field of the Invention

The present invention relates to a zero cross detection circuit and a sensor device.

2. Description of the Related Art

Heretofore, technical measures for preventing noise of an input signal in the vicinity of zero crossing in a zero cross detection circuit has been studied.

A conventional zero cross detection circuit is illustrated in FIG. 4. The conventional zero cross detection circuit has a comparator circuit 10, a comparator circuit 11 having a hysteresis, and a logic circuit 20.

The comparator circuit 10 provides a signal out10 indicating a result of detection of zero crossing by the first input signal n1 and the second input signal n2. The comparator circuit 11 provides a signal out11 indicating a result of comparison of the first input signal n1 and the second input signal n2 with one of threshold voltages (Vth1 or Vth2) which can be switched depending on a situation.

The logic circuit 20 determines the logic state of an output signal out20 according to the logic state of the signal out10 and the signal out11. In more detail, in case the signal out11 is Hi, the logic circuit 20 causes the transition of the signal out20 to Lo by the transition of the signal out10 from Hi to Lo but does not change the signal out20 by the transition of the signal out10 from Lo to Hi. In case the signal out11 is Lo, the logic circuit causes the transition of the signal out20 to Hi by the transition of the signal out10 from Lo to Hi but does not change the signal out20 by the transition of the signal out10 from Hi to Lo.

The above-described zero cross detection circuit can remove influence of noise in the input signal in the vicinity of zero crossing, and therefore a zero cross point can be detected with high accuracy (for example, see Japanese Patent Laid-Open No. 2017-211365).

SUMMARY OF THE INVENTION

However, in case the rotation of the motor is reversed immediately after the detection of zero crossing in a sensor device which detects the rotation of the motor with a magnetic sensor, for example, a conventional zero cross detection circuit may not detect the reverse rotation. In such a case the sensor device does not detect correctly the S pole and the N pole.

FIG. 5 is a timing chart showing an operation of the conventional zero cross detection circuit. Even though the rotation of the motor is reversed in a period between t51 and t52 and inverted first input signal n1 and inverted second input signal n2 are supplied, the signal out20 is not inverted. More specifically, the polarity is reverse in the detection result of the sensor device in a period between t52 and t53. Hence, the conventional zero cross detection circuit may not provide a signal according to an input signal in case the input signal is inverted immediately after the detection of zero crossing.

The present invention hence provides a zero cross detection circuit and a sensor device capable of detecting the reverse rotation of a motor immediately after the detection of zero crossing.

A zero cross detection circuit according to an embodiment of the present invention has a first comparator circuit receiving a first input signal n1 and a second input signal n2 and providing a first comparison result, a second comparator circuit having a hysteresis, receiving the first input signal n1 and the second input signal n2, and providing a second comparison result, and a logic circuit providing a zero cross detection signal based on the first comparison result and the second comparison result, in which the logic circuit provides a reverse signal to the second comparator circuit based on the first comparison result and the second comparison result.

The zero cross detection circuit of the present invention can detect the reverse rotation of a motor immediately after the detection of zero crossing, and therefore the sensor device can correctly detect the S pole and the N pole.

DETAILED DESCRIPTION OF THE PREFERRED EMBODIMENTS

Hereinafter, a zero cross detection circuit and a sensor device according to an embodiment of the present invention are described with reference to the drawings.

Figure 1:
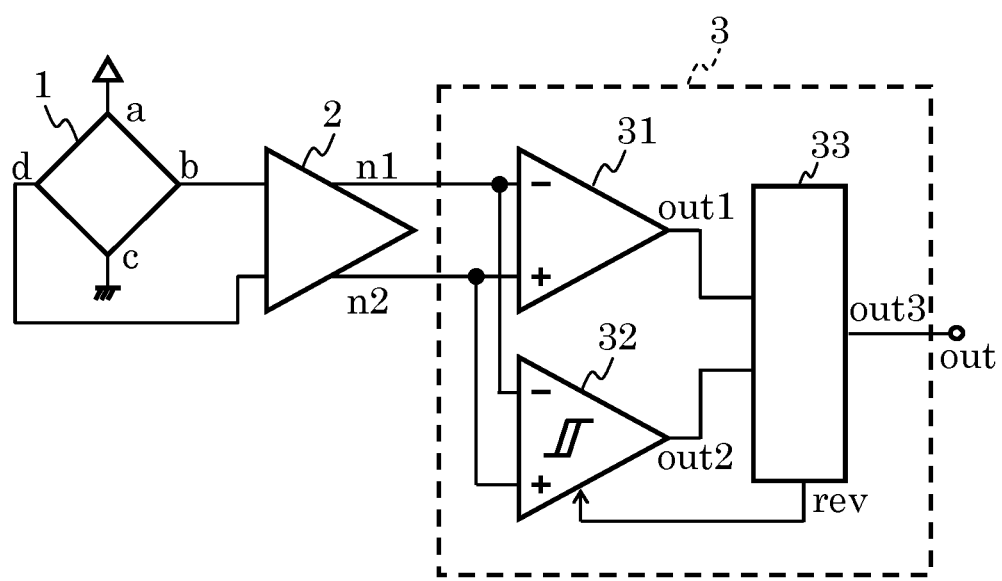
FIG. 1 is a block diagram illustrating a sensor device having a zero cross detection circuit according to an embodiment of the present invention.

FIG. 1 is a block diagram illustrating the sensor device having the zero cross detection circuit according to the embodiment of the present invention. The sensor device of the embodiment has a hall element 1, a differential amplification circuit 2, and a zero cross detection circuit 3. The zero cross detection circuit 3 has a comparator circuit 31, a comparator circuit 32 having hysteresis, and a logic circuit 33.

The hall element 1 has a terminal a connected to a power supply terminal and a terminal c connected to a ground terminal, and provides a voltage according to an applied magnetic field from a terminal b and a terminal d. The differential amplification circuit 2 has two input terminal to which the terminal b and the terminal d of the hall element 1 are connected, and provides an output voltage according to an input voltage from the output terminals n1 and n2. The zero cross detection circuit 3 has two input terminals to which output terminals n1 and n2 of the differential amplification circuit 2 are connected, and provides a zero cross detection signal from an output terminal out.

The comparator circuit 31 has an inverted input terminal, a non-inverted input terminal, and an output terminal out1. The comparator circuit 32 has an inverted input terminal, a non-inverted input terminal, a control terminal, and an output terminal out2. The logic circuit 33 has first and second input terminals, a reverse signal output terminal rev, and an output terminal out3.

In the comparator circuit 31, the output terminal n1 of the differential amplification circuit 2 is connected to the inverted input terminal, the output terminal n2 of the differential amplification circuit 2 is connected to the non-inverted input terminal, and the output terminal out1 is connected to the first input terminal of the logic circuit 33. In the comparator circuit 32, the output terminal n1 of the differential amplification circuit 2 is connected to the inverted input terminal, the output terminal n2 of the differential amplification circuit 2 is connected to the non-inverted input terminal, and the output terminal out2 is connected to the second input terminal of the logic circuit 33.

In the logic circuit 33, the reverse signal output terminal rev is connected to the control terminal of the comparator circuit 32 and the output terminal out3 is connected to the output terminal out of the zero cross detection circuit 3. The logic circuit 33 provides a result of a logic operation over a signal of the output terminal out1 and a signal of the output terminal out2 from the output terminal out3 and provides also a reverse signal from the reverse signal output terminal rev. The output from the output terminal out3 is supplied as a signal from the output terminal out of the zero cross detection circuit 3.

Next, an operation of the zero cross detection circuit 3 according to the embodiment is described with reference to FIG. 1, FIG. 2, and FIG. 3.

Figure 2:
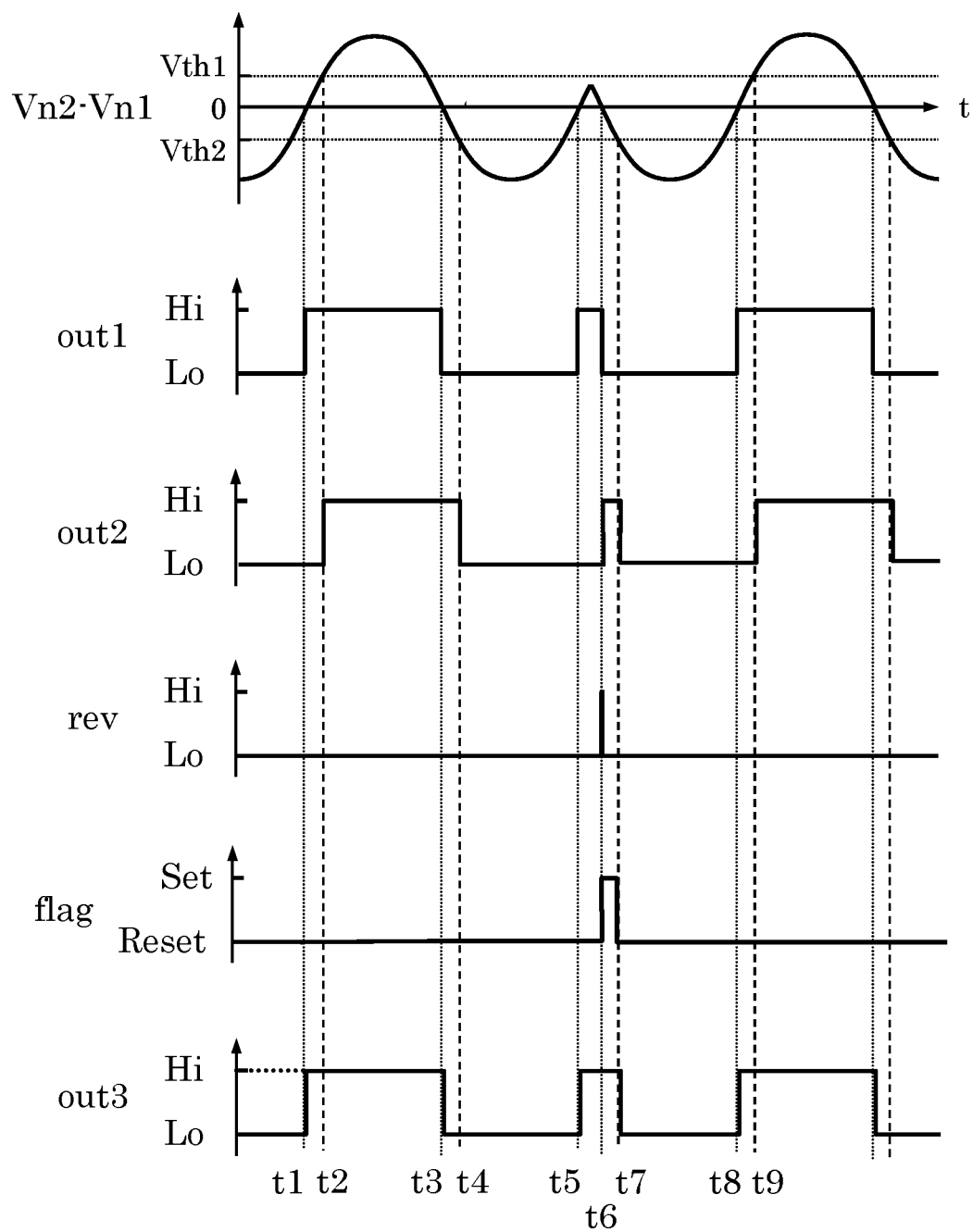
FIG. 2 is a timing chart showing an operation of the zero cross detection circuit according to the embodiment.
Figure 3:
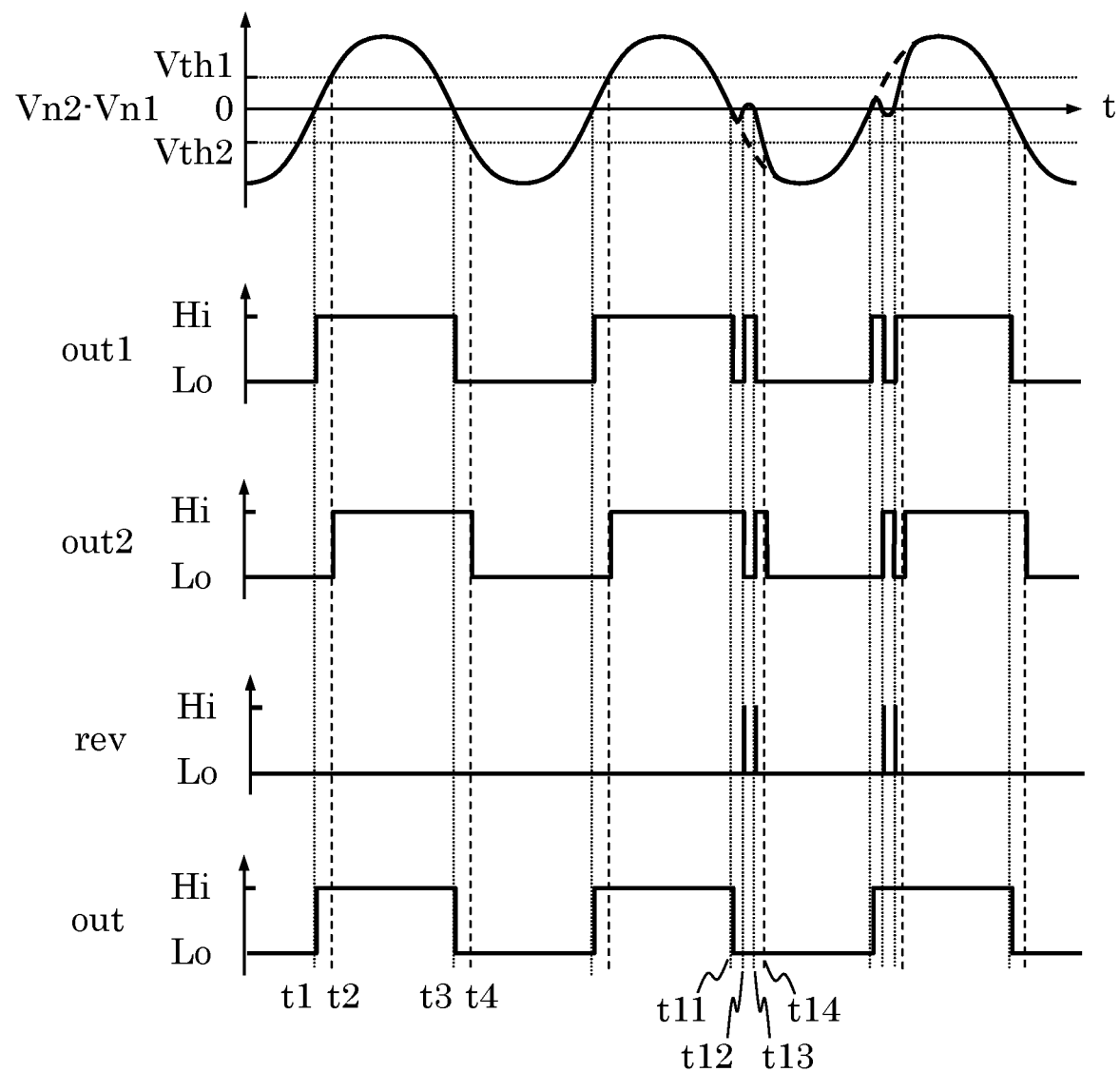
FIG. 3 is a timing chart showing an operation of the zero cross detection circuit according to the embodiment.
Figure 4:
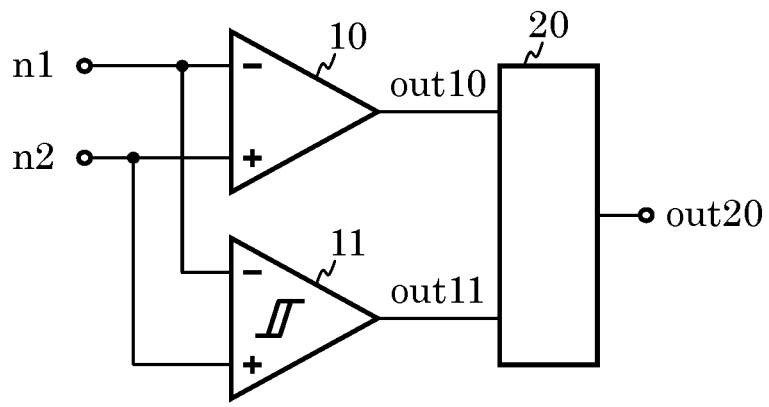
FIG. 4 is a block diagram illustrating a conventional zero cross detection circuit.
Figure 5:
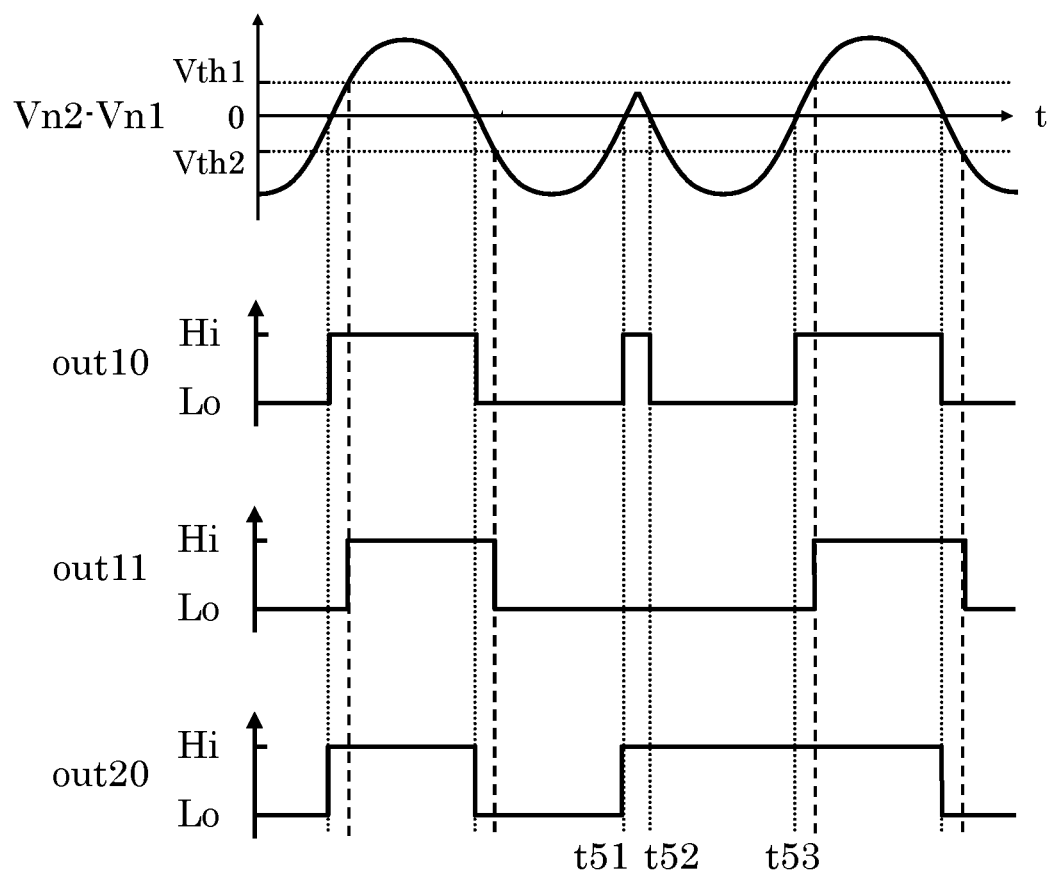
FIG. 5 is a timing chart showing an operation of a conventional zero cross detection circuit.

FIG. 2 and FIG. 3 are timing charts showing an operation of the zero cross detection circuit 3 according to the embodiment. In detail, FIG. 2 illustrates an operation in case the rotation of a motor is reversed immediately after detection of zero crossing. FIG. 3 illustrates an operation in case noise enters immediately after detection of zero crossing. FIG. 2 illustrates a difference Vn2−Vn1 between voltages Vn1 and Vn2 supplied to the comparator circuit 31 and the comparator circuit 32, respectively, a signal of the output terminal out1 of the comparator circuit 31, a signal of the output terminal out2 of the comparator circuit 32, a signal supplied from the reverse signal output terminal rev, the state of a flag inside the logic circuit 33, and a signal out3 supplied from the logic circuit 33 in this order from the top. Herein, the horizontal axis represents time and the vertical axis represents voltage. The flag indicates a set state and a reset state. Although FIG. 3 is the same as FIG. 2, the flag state is omitted from the drawing.

First, an operation of the comparator circuit 31 is described. The comparator circuit 31 provides Hi from the output terminal out1 when the voltage of the non-inverted input terminal is higher than the voltage of the inverted input terminal, and provides Lo from the output terminal out1 when the voltage of the non-inverted input terminal is lower than the voltage of the inverted input terminal. For example, when the input voltage Vn2−Vn1 exceeds 0 at the time t1 of FIG. 2, the voltage of the output terminal out1 is set to Hi from Lo. When the input voltage Vn2−Vn1 becomes lower than 0 at the time t3 of FIG. 2, the voltage of the output terminal out1 is set to Lo from Hi. More specifically, the comparator circuit 31 detects zero crossing of the input voltage Vn2−Vn1 and thereby inverts the signal of the output terminal out1.

Next, an operation of the comparator circuit 32 is described. The comparator circuit 32 provides Hi from the output terminal out2 when the voltage of the non-inverted input terminal is higher than the sum of the voltage of the inverted input terminal and a threshold voltage Vth1, and provides Lo from the output terminal out2 when the voltage of the non-inverted input terminal is lower than the sum of the voltage of the inverted input terminal and a threshold voltage Vth2. For example, when the input voltage Vn2−Vn1 exceeds the threshold voltage Vth1 at the time t2 of FIG. 2, the voltage of the output terminal out2 is set to Hi from Lo. Then, the threshold voltage is switched from the Vth1 to the Vth2. Thereafter, when the input voltage Vn2−Vn1 becomes lower than the threshold voltage Vth2 at the time t4 of FIG. 2, the voltage of the output terminal out2 is set to Lo from Hi. Then the threshold voltage is switched from the Vth2 to the Vth1. More specifically, the comparator circuit 32 operates as a comparator circuit having a hysteresis width |Vth1|+|Vth2|.

Furthermore, after a reverse signal is supplied to the control terminal from the reverse signal output terminal rev of the logic circuit 33, the comparator circuit 32 inverts a signal of the output terminal out2 and switches the threshold voltage. For example, after a reverse signal is supplied at the time t6 of FIG. 2, the voltage of the output terminal out2 is set to Hi from Lo. Then, the threshold voltage is switched from the Vth1 to the Vth2.

Next, an operation of the logic circuit 33 is described. The logic circuit 33 has the flag which is set when an operation different from a normal operation is detected, e.g., when a reversal of the output signal from the sensor device is detected, and determines the logic state of the output voltage signal out3 according to the flag state and the logic states of the output terminal out1 and the output terminal out2. However, the flag is provided in the logic circuit 33 and may be designed as appropriate by a latch circuit or the like, and the flag is not illustrated in the logic circuit 33 of FIG. 1.

When the flag is in the reset state and the logic state of the voltage of the output terminal out1 changes to become opposite to the logic state of the voltage of the output terminal out2, the logic circuit 33 inverts the voltage of the output terminal out3, and when the logic state of the voltage of the output terminal out2 changes to be the same as the logic state of the voltage of the output terminal out1, the logic circuit 33 maintains the voltage of the output terminal out3. When the logic state of the voltage of the output terminal out1 changes to be the same as the logic state of the voltage of the output terminal out2, the logic circuit 33 maintains the voltage of the output terminal out3, provides a reverse signal from the reverse signal output terminal rev, and then resets the flag when the flag is in the set state or sets the flag when the flag is in the reset state. Herein, since the reverse signal is a trigger signal for the comparator circuit 32 to change the state, the reverse signal is preferably a one-shot pulse signal. When the flag is in the set state and the logic state of the voltage of the output terminal out2 changes to be the same as the logic state of the voltage of the output terminal out1, the logic circuit 33 inverts the voltage of the output terminal out3 and resets the flag.

For example, when the voltage of the output terminal out1 becomes Hi at the time t1 of FIG. 2, while the voltage of the output terminal out2 is Lo, the voltage of the output terminal out3 becomes Hi from Lo. When the voltage of the output terminal out2 becomes Hi at the time t2 of FIG. 2, while the voltage of the output terminal out1 is Hi, the voltage of the output terminal out3 maintains Hi. The same also applies to the time t3 and the time t4.

Next, an operation in case the input voltage Vn2−Vn1 is reversed immediately after the zero cross detection circuit 3 detects zero crossing is described with reference to FIG. 2.

When the input voltage Vn2−Vn1 exceeds 0 at the time t5, the comparator circuit 31 sets the voltage of the output terminal out1 to Hi from Lo. Thereafter, when the input voltage Vn2−Vn1 is inverted and the input voltage Vn2−Vn1 becomes lower than 0 at the time t6, the comparator circuit 31 sets the voltage of the output terminal out1 to Lo from Hi. The input voltage Vn2−Vn1 does not exceed the threshold voltage Vth1 of the comparator circuit 32 at this time, and therefore the comparator circuit 32 maintains the voltage of the output terminal out2 at Lo.

A normal input voltage Vn2−Vn1 is supplied until the time t6, and therefore the flag is in the reset state in the logic circuit 33. Then, at the time t6 when the logic state of the voltage of the output terminal out1 changes to become the same as the logic state of the voltage of the output terminal out2, the voltage of the output terminal out3 maintains Hi, a reverse signal is supplied from the reverse signal output terminal rev, and the flag is set. After a reverse signal is supplied to the control terminal, the comparator circuit 32 sets the voltage of the output terminal out2 to Hi from Lo and switches the threshold voltage from the Vth1 to the Vth2.

The input voltage Vn2−Vn1 enters an inverted state after the time t6, then the input voltage Vn2−Vn1 becomes lower than the threshold voltage Vth2 of the comparator circuit 32 at the time t7, the comparator circuit 32 thereby sets the voltage of the output terminal out2 to Lo from Hi and switches the threshold voltage from the Vth2 to the Vth1. Herein, when the flag is in the set state and the logic state of the voltage of the output terminal out2 changes to be the same as the logic state of the voltage of the output terminal out1, the logic circuit 33 sets the voltage of the output terminal out3 to Lo from Hi and resets the flag. Since the flag is in the reset state, i.e., normal state, at the time t7, the logic circuit 33 provides the same voltage as that at the time t1 and the time t2 from the output terminal out3 also at the time t8 and t9.

As described above, since the zero cross detection circuit 3 of the embodiment can detect the reverse rotation of a motor immediately after the detection of zero crossing in a sensor device that detects the rotation of the motor with a magnetic sensor, for example, the sensor device can correctly detect the S pole and the N pole.

Next, an operation is described with reference to FIG. 3 in case the input voltage Vn2−Vn1 is affected by noise immediately after the zero cross detection circuit 3 detects zero crossing.

When the input voltage Vn2−Vn1 becomes lower than 0 at the time t11, the comparator circuit 31 sets the voltage of the output terminal out1 to Lo from Hi. Thereafter, when the input voltage Vn2−Vn1 exceeds 0 under the influence of noise at the time t12, the comparator circuit 31 sets the voltage of the output terminal out1 to Hi from Lo. At this time, the input voltage Vn2−Vn1 is not lower than the threshold voltage Vth2 of the comparator circuit 32, and therefore the comparator circuit 32 maintains the voltage of the output terminal out2 at Hi.

A normal input voltage Vn2−Vn1 is supplied until the time t12, and therefore the flag of the logic circuit 33 is in the reset state. Then, when the voltage of the output terminal out1 changes to be the same as the voltage of the output terminal out2 at the time t12, the logic circuit 33 maintains the voltage of the output terminal out3 at Lo, provides a reverse signal from the reverse signal output terminal rev, and sets the flag. After the reverse signal is supplied to the control terminal, the comparator circuit 32 sets the voltage of the output terminal out2 to Lo from Hi and switches the threshold voltage from the Vth2 to the Vth1.

When the input voltage Vn2−Vn1 becomes lower than 0 again under the influence of noise at the time t13, the comparator circuit 31 sets the voltage of the output terminal out1 to Lo from Hi. The input voltage Vn2−Vn1 does not exceed the threshold voltage Vth1 of the comparator circuit 32 at this time, and hence the comparator circuit 32 maintains the voltage of the output terminal out2 at Lo. Since the flag is in the set state, the logic circuit 33 maintains the voltage of the output terminal out3 at Lo, provides a reverse signal from the reverse signal output terminal rev, and resets the flag when the voltage of the output terminal out1 changes to be the same as the voltage of the output terminal out2.

Since the influence of noise on the input voltage Vn2−Vn1 is eliminated after the time t13 and the input voltage Vn2−Vn1 becomes lower than the threshold voltage Vth2 of the comparator circuit 32 at the time t14, the comparator circuit 32 sets the voltage of the output terminal out2 to Lo from Hi and switches the threshold voltage from the Vth2 to the Vth1. Herein, the flag is in the reset state and when the voltage of the output terminal out2 changes to be the same as the voltage of the output terminal out1, the logic circuit 33 maintains the voltage of the output terminal out3 at Lo and does not set the flag. Then, the zero cross detection circuit 3 returns to a normal state after the time t14.

Moreover, although an explanation is omitted, even affected by noise when the input voltage Vn2−Vn1 exceeds 0, the logic circuit 33 can similarly provide a correct voltage to the output terminal out3 without influence of the noise.

As described above, since the zero cross detection circuit and the sensor device of the embodiment can detect reverse rotation of a motor immediately after detecting zero crossing, the sensor device can correctly detect the S pole and the N pole.

As described above, although the embodiment of the present invention is described, it is a matter of course that the present invention is not limited to the embodiment described above and can be variously altered without deviating from the gist and the scope of the present invention.

For example, although the comparator circuit 32 has the configuration in which a reverse signal is supplied to the control terminal from the reverse signal output terminal rev of the logic circuit 33, a signal of the output terminal out1 of the comparator circuit 31 may be supplied.

What is claimed is:

1. A zero cross detection circuit, comprising:
a first comparator circuit configured to receive a first input signal and a second input signal which are output signals from a sensor element, and provide a first comparison result;
a second comparator circuit having a hysteresis and configured to receive the first input signal and the second input signal and provide a second comparison result; and
a logic circuit configured to provide a zero cross detection signal based on the first comparison result and the second comparison result, and provide a reverse signal to the second comparator circuit based on the first comparison result and the second comparison result.

2. The zero cross detection circuit according to claim 1, wherein
the logic circuit has a flag which indicates a reversal of an output signal from the sensor element based on the first comparison result and the second comparison result, and provides the zero cross detection signal according to a state of the flag.

3. The zero cross detection circuit according to claim 1, wherein the second comparator circuit has a first threshold voltage and a second threshold voltage which are switched according to a state of the first input signal and the second input signal, and after receiving the reverse signal from the logic circuit, inverts a logic state of the second comparison result and provides the second comparison result with an inverted logic state and switches the first threshold voltage and the second threshold voltage.

4. The zero cross detection circuit according to claim 2, wherein the second comparator circuit has a first threshold voltage and a second threshold voltage which are switched according to a state of the first input signal and the second input signal, and after receiving the reverse signal from the logic circuit, inverts a logic state of the second comparison result and provides the second comparison result with an inverted logic state and switches the first threshold voltage and the second threshold voltage.

5. A sensor device comprising:

a sensor element configured to output a signal according to strength of a physical quantity to be applied; and the zero cross detection circuit according to claim 1 configured to perform zero cross detection of the signal supplied from the sensor element.

6. A sensor device comprising:

a sensor element configured to output a signal according to strength of a physical quantity to be applied; and the zero cross detection circuit according to claim 2 configured to perform zero cross detection of the signal supplied from the sensor element.

7. A sensor device comprising:

a sensor element configured to output a signal according to strength of a physical quantity to be applied; and the zero cross detection circuit according to claim 3 configured to perform zero cross detection of the signal supplied from the sensor element.

8. A sensor device comprising:

a sensor element configured to output a signal according to strength of a physical quantity to be applied; and the zero cross detection circuit according to claim 4 configured to perform zero cross detection of the signal supplied from the sensor element.

* * * * *